US006797541B2

(12) United States Patent
Chun et al.

(10) Patent No.: US 6,797,541 B2
(45) Date of Patent: Sep. 28, 2004

(54) LEADLESS SEMICONDUCTOR PRODUCT PACKAGING APPARATUS HAVING A WINDOW LID AND METHOD FOR PACKAGING

(75) Inventors: DoSung Chun, Muang nonthaburi (TH); Sung Chul Chang, Bangkok (TH)

(73) Assignee: Millenium Microtech Co., Ltd. (TH)

( * ) Notice: Subject to any disclaimer, the term of this patent is extended or adjusted under 35 U.S.C. 154(b) by 61 days.

(21) Appl. No.: 10/302,334

(22) Filed: Nov. 22, 2002

(65) Prior Publication Data

US 2003/0062606 A1 Apr. 3, 2003

Related U.S. Application Data

(62) Division of application No. 09/668,423, filed on Oct. 6, 2000, now Pat. No. 6,525,405.
(60) Provisional application No. 60/193,319, filed on Mar. 30, 2000.

(51) Int. Cl.$^7$ .............................. H01L 21/48; H05K 3/30
(52) U.S. Cl. .......................... 438/111; 438/123; 29/838
(58) Field of Search .............................. 438/22, 26, 48, 438/106, 110, 111, 112, 121, 123, 124–127; 29/825, 838, 841, 855, 856; 257/666, 667, 672, 676, 684, 687, 692–696, 704, 787; 361/723, 752, 772–776, 757, 813

(56) References Cited

U.S. PATENT DOCUMENTS 6,525,405 B1 * 2/2003 Chun et al. ................. 257/666

* cited by examiner

Primary Examiner—Alonzo Chambliss
(74) Attorney, Agent, or Firm—LaRiviere, Grubman & Payne, LLP

(57) ABSTRACT

A natural-resource-conservative, environmentally-friendly, cost-effective, leadless semiconductor packaging apparatus, having superior mechanical and electrical properties, and having an optional windowed housing which uniquely seals and provides a mechanism for viewing the internally packaged integrated semiconductor circuits (chips/die). A uniquely stamped and/or bent lead-frame is packaged by a polymeric material during a unique compression-molding process using a mold, specially contoured to avoid the common "over-packaging" problem in related art techniques. The specially contoured mold facilitates delineation of the internal portions from the external portions of the lead-frame, as the external portions are the effective solderable areas that contact pads on a printed circuit board, thereby avoiding a laborious environmentally-unfriendly masking step and de-flashing step, streamlining the device packaging process. The compression-mold effectively provides a compressive sealing orifice from which the effective solderable areas of the lead-frame may extend and be exposed and, thus, avoid being coated with the polymer which is uniquely contained by the mold for packaging the internal portions of the lead-frame. The lead-frame is uniquely stamped and/or bent, conforming it to electro-mechanical requirements of a particular semiconductor product. By uniquely stamping and/or bending, the related art "half-etching" of the lead for conforming it to electro-mechanical requirements of the packaged semiconductor product is no longer required. Environmental enhancement is achieved by conserving natural resources and by eliminating hazardous material by-products otherwise liberated in related art packaging techniques.

6 Claims, 7 Drawing Sheets

LEADLESS SEMICONDUCTOR PRODUCT PACKAGING APPARATUS HAVING A WINDOW LID AND METHOD FOR PACKAGING

CROSS-REFERENCE TO RELATED APPLICATIONS

This application is a co-pending U.S. Ser. No. 09/668,423, entitled LEADLESS SEMICONDUCTOR PRODUCT PACKAGING APPARATUS HAVING GLASS WINDOW LID AND METHOD FOR PACKAGING, filed Oct. 6, 2000 now U.S. Pat. No. 6,525,405 which, in turn, claims priority from and is related to U.S. Pat. No. 60/193,319, also entitled LEADLESS SEMICONDUCTOR PRODUCT PACKAGING APPARATUS HAVING GLASS WINDOW LID AND METHOD FOR PACKAGING, filed Mar. 30, 2000, by the same Applicants.

This application claims priority from Korean Application Serial No. 2002-42431, filed Jul. 19, 2002.

TECHNICAL FIELD

The present invention relates to semiconductor product packaging and methods of fabrication for producing a packaged semiconductor product. More particularly, the present invention relates to leadless semiconductor product packaging and methods of fabrication for producing leadless packaged semiconductor product. Even more particularly, the present invention relates to leadless semiconductor product packaging and methods of fabrication for mass-producing packaged semiconductor product without employing time-consuming, environmentally-unfriendly related art lead-frame etching and de-flashing techniques.

BACKGROUND OF THE INVENTION

In response to manufacturing cost concerns relating to populating printed circuit boards with electronic product having the requisite functional circuits, the semiconductor product packaging industry has developed a leadless circuit component product (also known as a surface mountable electronic product), hereinafter referred to as a "leadless product." The leadless product, as the name implies, is a packaged electronic product that does not require the use of physical leads for being inserted into mating holes provided on a planar board as a mechanical mounting means nor as an electrical connection with other electronic components forming the circuit on such a planar board. In general, the leadless product facilitates manufacturing of a printed circuit card, thereby eliminating the inserting of component leads into the board holes and the soldering of these leads to the board's solder pads. The leadless technology has been well accepted as an option for packaging electronic components since early 1980. By example, a current related art industrial product includes "QFN" (Quad Flat No Lead, registered as JEDEC STD MO 197, 198, 208, 209, and 220). Of course, the electronic component function may still be available in a lead-type packaging structure.

In the related leadless semiconductor product packaging art, "half-etching" techniques are used for forming the lead-frame, generating considerable hazardous material (e.g., acid waste, metals waste, and possibly organic solvent waste); and an adhesive tape is used to temporarily mask effective solderable areas of the lead-frame (also known as the "outer I/O") from the packaging material to be applied during the molding process in order to preserve such effective solderable areas of the lead-frame in an un-insulated state, generating undue tape and possibly organic solvent waste. In another related semiconductor product packaging art technique, the lead-frame is completely packaged by a molding process; and the effective solderable areas of the lead-frame must be subsequently "de-flashed" in a process wherein such portions are blasted with a highly pressurized aqueous slurry of particulates (i.e., wet-blasting) to remove the "overpackaging," thereby generating considerable hazardous material in the form of polymeric waste slurry. Therefore, a need exists for providing a natural resource-onservative and environrmentally-friendly method and apparatus for packaging a leadless semiconductor product.

BRIEF SUMMARY OF THE INVENTION

The present invention, a leadless semiconductor packaging apparatus, provides a costeffective product, having superior mechanical, electrical, and thermal properties, and having an optional window lid feature (i.e., a sight lid) which not only uniquely seals, but also provides a mechanism for viewing the internally packaged integrated semiconductor circuits (chips/die). Cost reduction is achieved by (a) optionally using polymeric materials, such as epoxies, rather than conventional related art ceramic materials for packaging devices, and (b) simplifying the packaging process, thereby improving productivity.

The present invention employs a unique "stamped" and/or "bent" standard solder-plated or pre-plated lead-frame which is packaged by a polymeric material during a molding process, in contrast to the related art "half-etched" lead-frame. The process of the present invention involves providing a unique compression-type mold, specially contoured to avoid "overpackaging," of the effective solderable areas of the lead-frame which is a common problem in the related art techniques. Applicants' invention results in streamlining the device fabrication and packaging process. The specially contoured compression-mold facilitates delineation of the internal portions from the external portions of the lead-frame, where the external portions have the effective solderable areas that contact pads on a printed circuit board. The mold effectively provides a "compressive sealing orifice" from which the effective solderable areas of the lead-frame may extend and be exposed and, thus, avoid being coated with the polymer which is contained by the mold for packaging the internal portions of the lead-frame, thereby avoiding a laborious masking step and a tedious de-flashing step.

The present invention applies the unique technique of "stamping" and/or "bending" of the lead-frame, thereby conforming it to electro-mechanical requirements of a particular semiconductor product. By stamping and/or bending the lead-frame material into the desired configuration, the present invention does not require old art "half-etching" of the lead for conforming it to electro-mechanical requirements of the packaged semiconductor product. By example, the related art process "half-etches" the lead-frame (e.g., 10 mils of raw conducting material are etched to about 5 mils, thereby generating a large volume of acid and conducting material hazardous waste) in order to create the requisite shape. Thus, thinner lead-frame material, such as that in a range of 6 mils or less, may be used with the present invention. The present invention offers several more distinctive advantages: (a) customer-specifiable package size, (b) applicable existing surface mount technology (SMT) processes, (c) overall improved performance at a lower cost, (d) complete absence of hazardous material by-products in full-scale production (environmentally-friendly, i.e., no acid waste, no metals waste, no liberation of volatile organic compounds, and no solid polymeric slurry waste), and (e) thinner lead-frame material (natural-resource-conservative).

DESCRIPTION OF THE DRAWING

For a better understanding of the present invention, reference is made to the below-referenced accompanying Drawing. Reference numbers refer to the same or equivalent parts of the present invention throughout the several figures of the Drawing.

DETAILED DESCRIPTION OF THE INVENTION

Figure 1A:
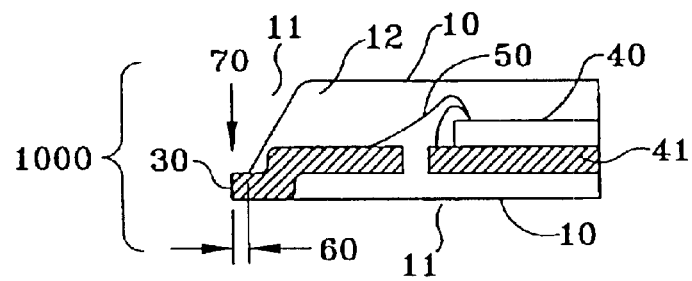
FIG. 1A is a cross-sectional view of a near chip-size basic leadless semiconductor packaging apparatus having packaging mold-lines shown with respect to a leadless semiconductor device configuration having a die located in the "up" position with a wire bonded to a stamped lead frame and another wire bonded to a die attach pad, in accordance with the present invention.

FIG. 1A illustrates, in cross-section, a first embodiment, a "near chip-size" leadless semiconductor packaging apparatus 1000 (i.e., where the packaging and external lead portions extend minimally beyond the plan-form area of a given chip) having packaging mold-lines 10 and a unique "stamped" and "bent" lead-frame 30 formed by "stamping" and "bending" a conductive material such as copper, with an effective solderable length 60 and effecting a bend 34, the unique stamped and bent lead-frame 30 being uniquely compressively retained by a mold 11 (not shown), in accordance with the present invention. Other leadless semiconductor device components therein shown are a die 40, a die attach pad 41 which may be formed of a pad metal, and a bonded wire 50 formed from a conductive material such as gold. The mold 11 (not shown) uniquely effectively retains, by compression (e.g., using a hot-press), a polymeric material 12, such as a polymeric molding compound, for surrounding only the interior portion of the stamped and bent lead-frame 30, thereby uniquely preserving a clean solderable area on the stamped and bent lead-frame 30, and thereby avoiding the environmentally-unfriendly related art need for deflashing of excess packaging material. A method for trimming the stamped and bent lead-frame 30 may include sawing or punch-cutting in the direction indicated by arrow 70.

Figure 1B:
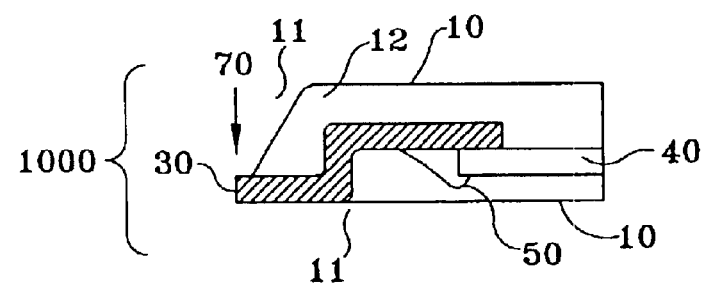
FIG. 1B is a cross-sectional view of a near chip-size leadless semiconductor packaging apparatus having packaging mold-lines shown with respect to a leadless semiconductor device configuration having a stamped lead-frame and a die with a wire therebetween bonded in the "down" position, in accordance with the present invention.

FIG. 1B is a cross-sectional view of a second embodiment, a near chip-size leadless semiconductor packaging apparatus 1000, having packaging mold-lines 10, a unique stamped and bent lead-frame 30 formed by stamping and bending a conductive material such as copper, effecting a bend 34, and a die 40 with a wire 50, formed from a conductive material such as gold, therebetween bonded in the "down" position, in accordance with the present invention. These components are uniquely compression-molded in the manner discussed with respect to FIG. 1A.

Figure 1C:
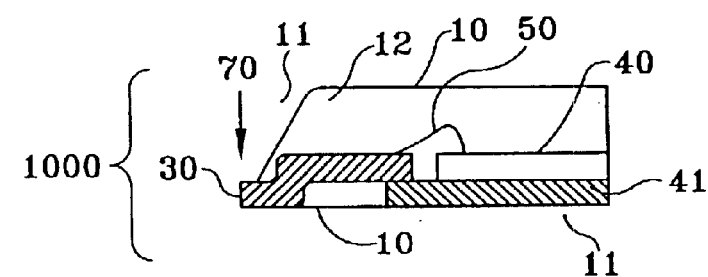
FIG. 1C is a cross-sectional view of a near chip-size thermal leadless semiconductor packaging apparatus having packaging mold-lines shown with respect to a leadless semiconductor device configuration having a stamped lead-frame and a die with a wire therebetween bonded in the "up" position and with the die sharing a common die attach pad, in accordance with the present invention.

FIG. 1C is a cross-sectional view of a third embodiment, a near chip-size thermal leadless semiconductor packaging apparatus 1000 having packaging mold-lines 10, a unique stamped and bent lead-frame 30 formed by stamping and bending a conductive material such as copper, effecting a bend 34, and a die 40 with a wire 50 formed from a conductive material such as gold, therebetween bonded in the "up" position and with the stamped and bent lead-frame 30 and the die 40 sharing a common die attach pad 41 being unmolded (i.e., exposed), in accordance with the present invention. These components are uniquely compression-molded in the manner discussed with respect to FIG. 1A.

Figure 1D:
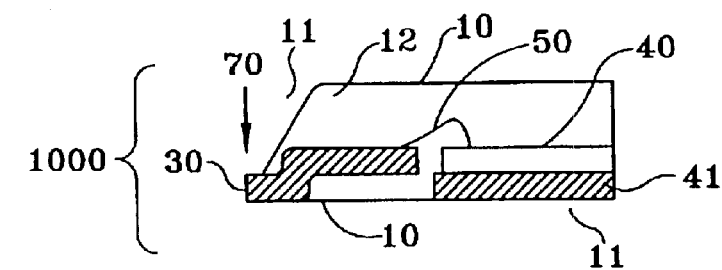
FIG. 1D is a cross-sectional view of a near chip-size thermal leadless semiconductor packaging apparatus having packaging mold-lines shown with respect to a leadless semiconductor device configuration having a stamped lead-frame and a die with a wire therebetween bonded in the "up" position and with a lower surface of the die attach pad being unfolded (i.e., exposed), in accordance with the present invention.

FIG. 1D is a cross-sectional view of a fourth embodiment, a near chip-size thermal leadless semiconductor packaging apparatus 1000 having packaging mold-lines 10, a unique stamped and bent lead-frame 30 formed stamping and bending a conductive material such as copper, effecting a bend 34, and a die 40 with a wire 50 formed from a conductive material such as gold, therebetween bonded in the "up" position and with a lower surface of the die attach pad 41 being unmolded (i.e., exposed), in accordance with the present invention. These components are uniquely compression-molded in the manner discussed with respect to FIG. 1A.

Figure 1E:
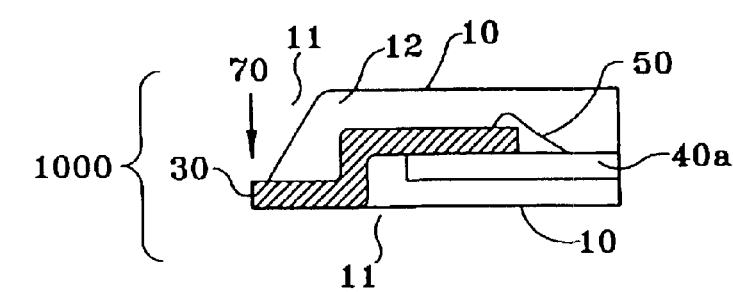
FIG. 1E is a cross-sectional view of a near chip-size leadless semiconductor packaging apparatus having packaging mold-lines shown with respect to a leadless semiconductor device configuration having a stamped lead-frame and a center pad located beneath the stamped lead-frame with a wire bonded therebetween in the "up" position, in accordance with the present invention.

FIG. 1E is a cross-sectional view of a fifth embodiment, a near chip-size leadless semiconductor packaging apparatus 1000 having packaging mold-lines 10, a unique stamped and bent lead-frame 30 formed by stamping and bending a conductive material such as copper, effecting a bend 34, and a center pad 40a located beneath the stamped and bent lead-frame 30 with awire 50 formed from a conductive material such as gold, bonded therebetween in the "up"position, in accordance with the present invention. These components are uniquely compression-molded in the manner discussed with respect to FIG. 1A.

Figure 1F:
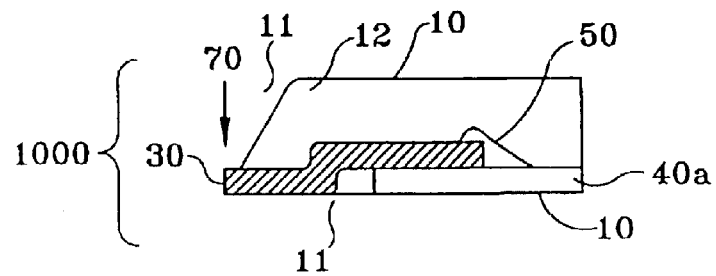
FIG. 1F is a cross-sectional view of a near chip-size leadless semiconductor packaging apparatus having packaging mold-lines shown with respect to a leadless semiconductor device configuration having a stamped lead-frame and a center pad located beneath the stamped lead-frame with a wire bonded therebetween in the "up" position and a lower surface of the center pad being unmolded, in accordance with the present invention.

FIG. 1F is a cross-sectional view of a sixth embodiment, a near chip-size leadless semiconductor packaging apparatus 1000 having packaging mold-lines 10, a stamped and bent lead-frame 30 formed by stamping and bending a conductive material such as copper, effecting a bend 34, and a center pad 40a located beneath the stamped and bent lead-frame 30 with a wire 50 formed from a conductive material such as gold, bonded therebetween in the "up" position and a lower surface of the center pad 40a being unmolded (i.e., exposed), in accordance with the present invention. These components are uniquely compression-molded in the manner discussed with respect to FIG. 1A.

Figure 1G:
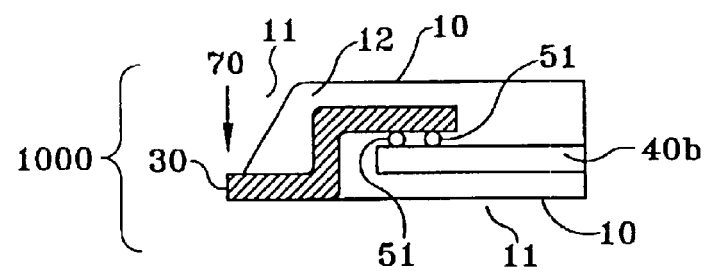
FIG. 1G is a cross-sectional view of a near chip-size leadless semiconductor packaging apparatus having packaging mold-lines shown with respect to a leadless semiconductor device configuration having a stamped lead-frame and a flip chip located beneath the stamped lead-frame with at least one conducting particle contacting and being disposed between the lead-frame and the flip chip, in accordance with the present invention.

FIG. 1G is a cross-sectional view of a seventh embodiment, a near chip-size leadless semiconductor packaging apparatus 1000 having packaging mold-lines, a unique stamped and bent lead-frame 30 formed by stamping and bending a conductive material such as copper, effecting a bend 34, and a flip chip 40b located beneath the stamped and bent lead-frame 30 with at least one conducting particle 51 contacting and being disposed between the stamped and bent lead-frame 30 and the flip chip 40b, in accordance with the present invention. These components are uniquely compression-molded in the manner discussed with respect to FIG. 1A.

Figure 1H:
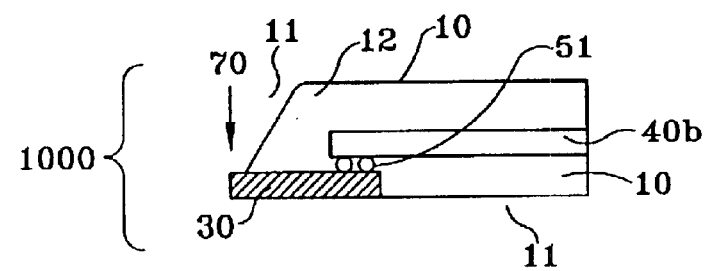
FIG. 1H is a cross-sectional view of a chip-size leadless semiconductor packaging apparatus having packaging mold-lines shown with respect to a leadless semiconductor device configuration having a stamped lead-frame and a flip chip located above the stamped lead-frame with at least one conducting particle contacting and being disposed between the lead-frame and the flip chip, in accordance with the present invention.

FIG. 1H is a cross-sectional view of an eighth embodiment, a "chip-size" leadless semiconductor packaging apparatus 1000 having packaging mold-lines 10, a unique stamped lead-frame 30 formed by stamping a conductive material such as copper, and a flip chip 40b located above the stamped lead-frame 30 with at least one conducting particle 51 contacting and being disposed between the stamped lead-frame 30 and the flip chip 40b, in accordance with the present invention. These components are uniquely compression-molded in the manner discussed with respect to FIG. 1A.

Figure 1I:
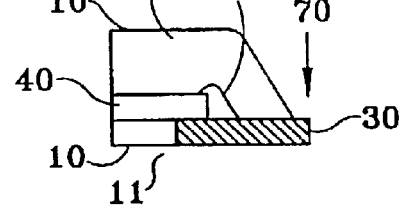
FIG. 1I is a cross-sectional view of a chip-size leadless semiconductor packaging apparatus having packaging mold-lines shown with respect to a leadless semiconductor device configuration having a die located on a lead-frame and a wire bonded therebetween in the "up" position, in accordance with the present invention.

FIG. 1I is a cross-sectional view of a ninth embodiment, a chip-size leadless semiconductor packaging apparatus 1000 (i.e., where the packaging and external lead portions extend very minimally beyond the plan-form area of a given chip, where the plan-form package area is less than or equal to 1.2 times the die plan-form area) having packaging mold-lines 10, a die 40 located on a unique stamped lead-frame 30 formed by stamping a conductive material such as copper, and a wire 50 formed from a conductive material such as gold, bonded therebetween in the "up" position, in accordance with the present invention. These components are uniquely compression-molded in the manner discussed with respect to FIG. 1A.

Figure 1J:
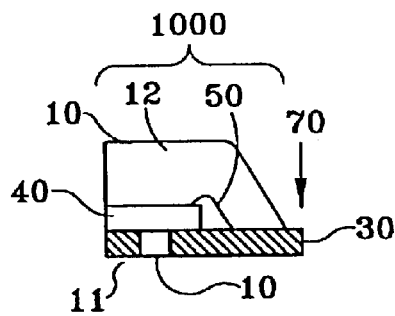
FIG. 1J is a cross-sectional view of a chip-size leadless semiconductor packaging apparatus having packaging mold-lines shown with respect to a leadless semiconductor device configuration having a die located on at least one lead-frame and a wire bonded therebetween in the "up" position, in accordance with the present invention.

FIG. 1J is a cross-sectional view of a tenth embodiment, a chip-size leadless semiconductor packaging apparatus 1000 having packaging mold-lines 10, a die 40 located on at least one unique stamped lead-frame 30 formed by stamping a conductive material such as copper, and a wire 50 formed from a conductive material such as gold, bonded therebetween in the "up" position, in accordance with the present invention. These components are uniquely compression-molded in the manner discussed with respect to FIG. 1A.

Figure 1K:
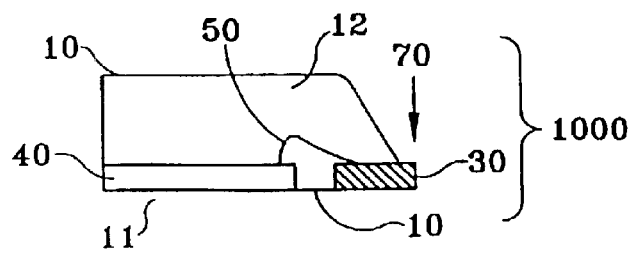
FIG. 1K is a cross-sectional view of a chip-size leadless semiconductor packaging apparatus having packaging mold-lines shown with respect to a leadless semiconductor device configuration having an exposed die laterally located with regard to the lead-frame and a wire bonded therebetween in the "up" position, in accordance with the present invention.

FIG. 1K is a cross-sectional view of an eleventh embodiment, a leadless semiconductor packaging apparatus 1000 having packaging mold-lines, an exposed die 40 laterally located with regard to the unique stamped lead-frame 30 formed by stamping a conductive material such as copper, and a wire 50 formed from a conductive material such as gold, bonded therebetween in the "up" position, in accordance with the present invention. These components are uniquely compression-molded in the manner discussed with respect to FIG. 1A.

Figure 1L:
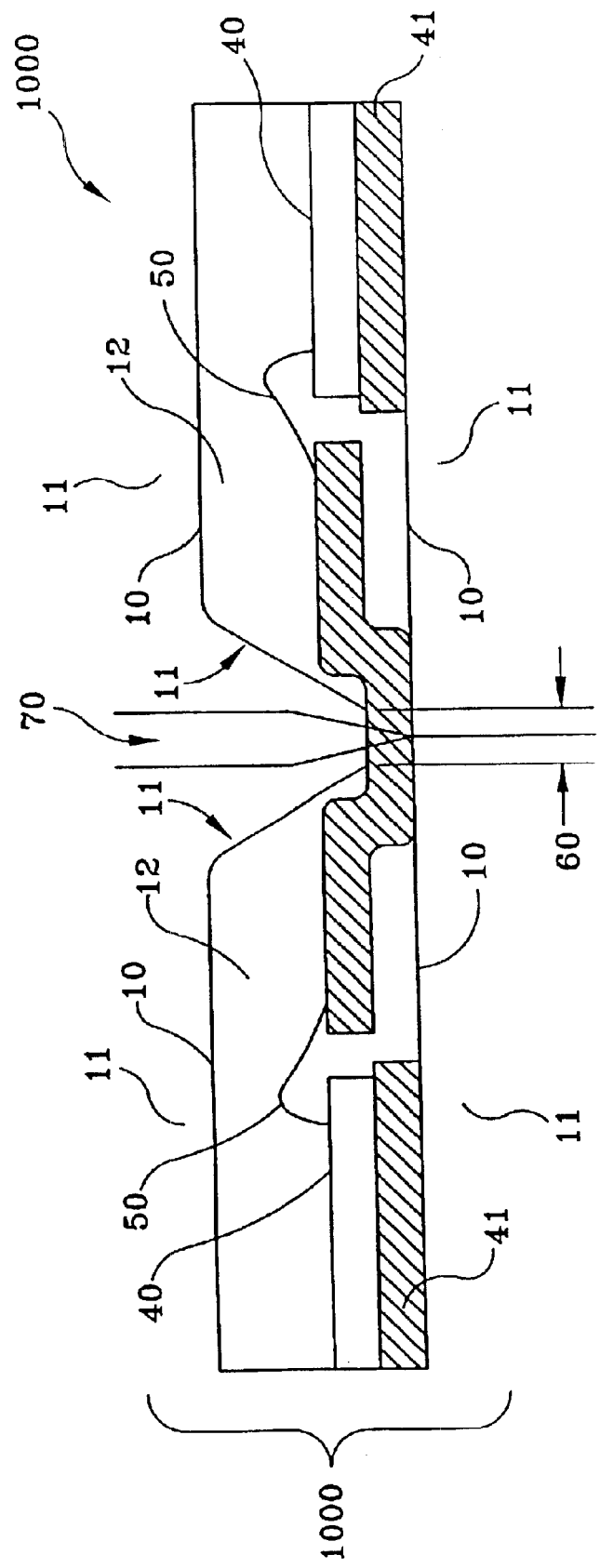
FIG. 1L is a cross-sectional view of a leadless semiconductor packaging apparatus having packaging mold-lines shown with respect to at least one leadless semiconductor device, as would occur during a manufacturing process, in accordance with the present invention.

FIG. 1L illustrates, in cross-section, a near chip-size leadless semiconductor packaging apparatus 1000, consistent with the third embodiment, having packaging mold-lines 10, at least one unique stamped and bent lead-frame 30 which may be formed by stamping and bending a conductive material such as copper, effecting a bend 34, with an effective solder able length 60, being retained by a mold 11 (not shown) as would occur during a manufacturing process, in accordance with the present invention. Other leadless semiconductor device components therein shown are at least one die 40, at least one die attach pad 41 which may be formed of a pad metal, and at least one bonded wire 50 formed from a conductive material such as gold. In packaging a plurality of leadless semiconductor devices, a method for separating the mass-produced packaged devices in an assembly line fashion may include sawing or punch-cutting in the direction indicated by arrow 70. The mold 11 (not shown) uniquely and effectively retains, via compressive forces, at least one polymeric material 12 for surrounding only the interior portion of the at least one unique stamped and bent lead-frame 30 (i.e., without leakage to an exterior portion the at least one stamped lead-frame), thereby preserving clean solderable areas on an external portion of the at least one unique stamped and bent lead-frame 30, and thereby avoiding the related art need for de-flashing of excess packaging material.

Figure 2:
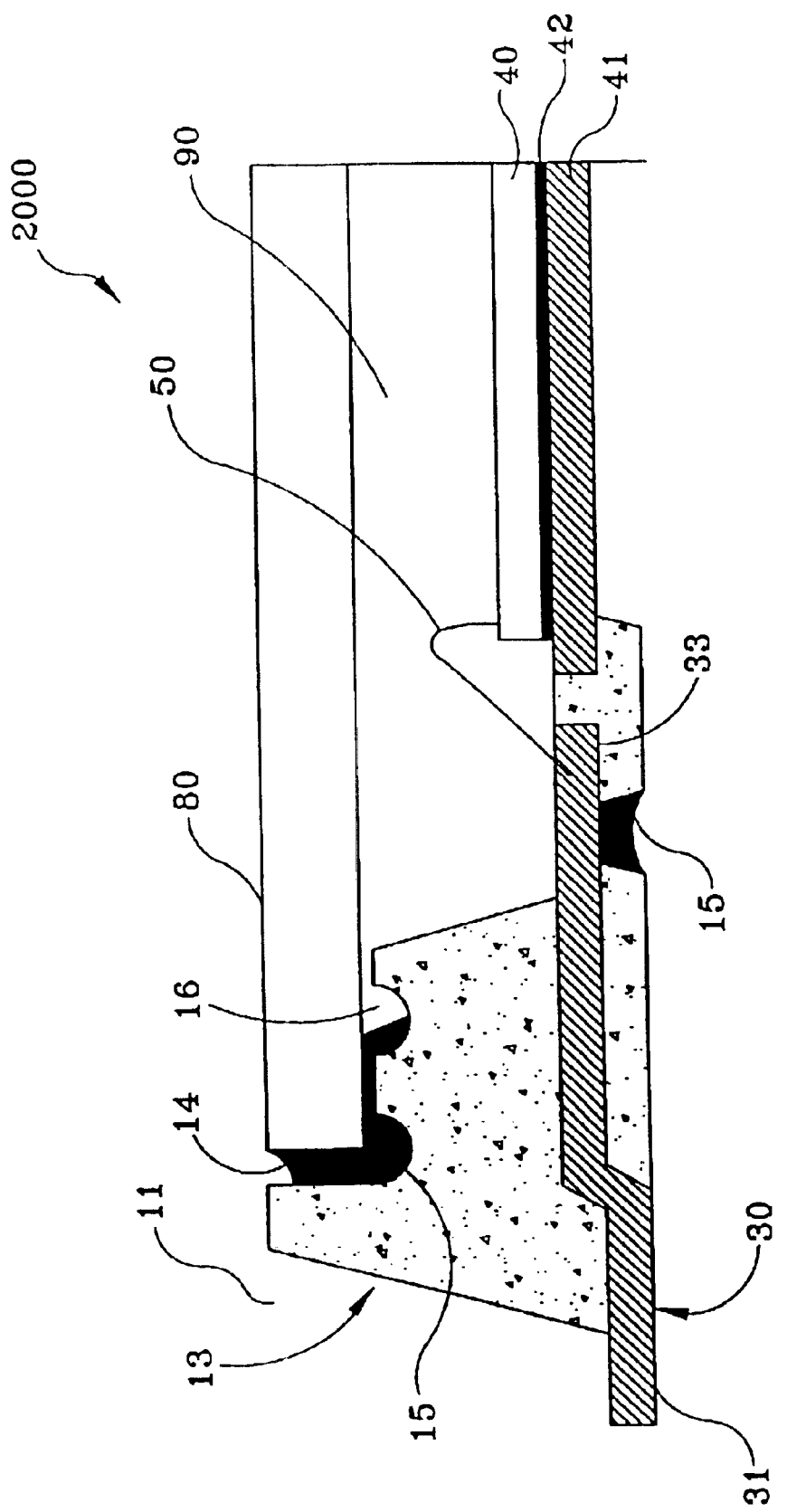
FIG. 2 is a cross-sectional view of a windowed leadless semiconductor packaging apparatus with a leadless semiconductor device configuration having a stamped lead frame, a die, and a bonded wire being packaged by a sight lid sealed against a cured polymeric material having a flush mold-line located at the interior portion of the stamped lead frame, in accordance with the present invention.

FIG. 2 illustrates, in cross-section, another embodiment of the present invention, a windowed leadless semiconductor packaging apparatus 2000 having a leadless semiconductor device comprising a unique stamped and bent lead-frame 30 formed by stamping and bending a conductive material such as copper, effecting a bend 34, a die 40 adhered to a die attach pad 41 by a non-electrically conductive adhesive material 42, and a wire 50 formed from a material such as gold, being packaged by a sight lid 80, formed from a visually transparent material such as a glass or a high temperature polymer, uniquely sealed against a cured polymeric material body 13 by a sealant material 14 such as a UV-curable epoxy resin, in accordance with the present invention. Sealant material 14 is compressed by the sight lid 80 into an outboard channel 15 of a unique dual channel sealant seat such that a portion of the sealant material 14 flows into an inboard channel 16 for providing a uniquely larger sealing surface area and better sealing against contaminant entry. The present invention, however, is not limited to the use of dual channels, but may utilize at least one channel as required by the given semiconductor circuit to be packaged. The cured polymeric material body 13 has an overlapping tapered mold line located at both the exterior portion 31 and the interior portion 32 of the stamped lead-frame 30 and a flush mold line located between the die attach pad 41 and the interior portion 3 3 of stamped leadframe 30. A reinforced fill material 15 is cured unto a lower surface of the interior portion 33 of the stamped lead-frame 30, such interior portion 33 formerly being uniquely compressively retained by the mold 11 (not shown).

Figure 3:
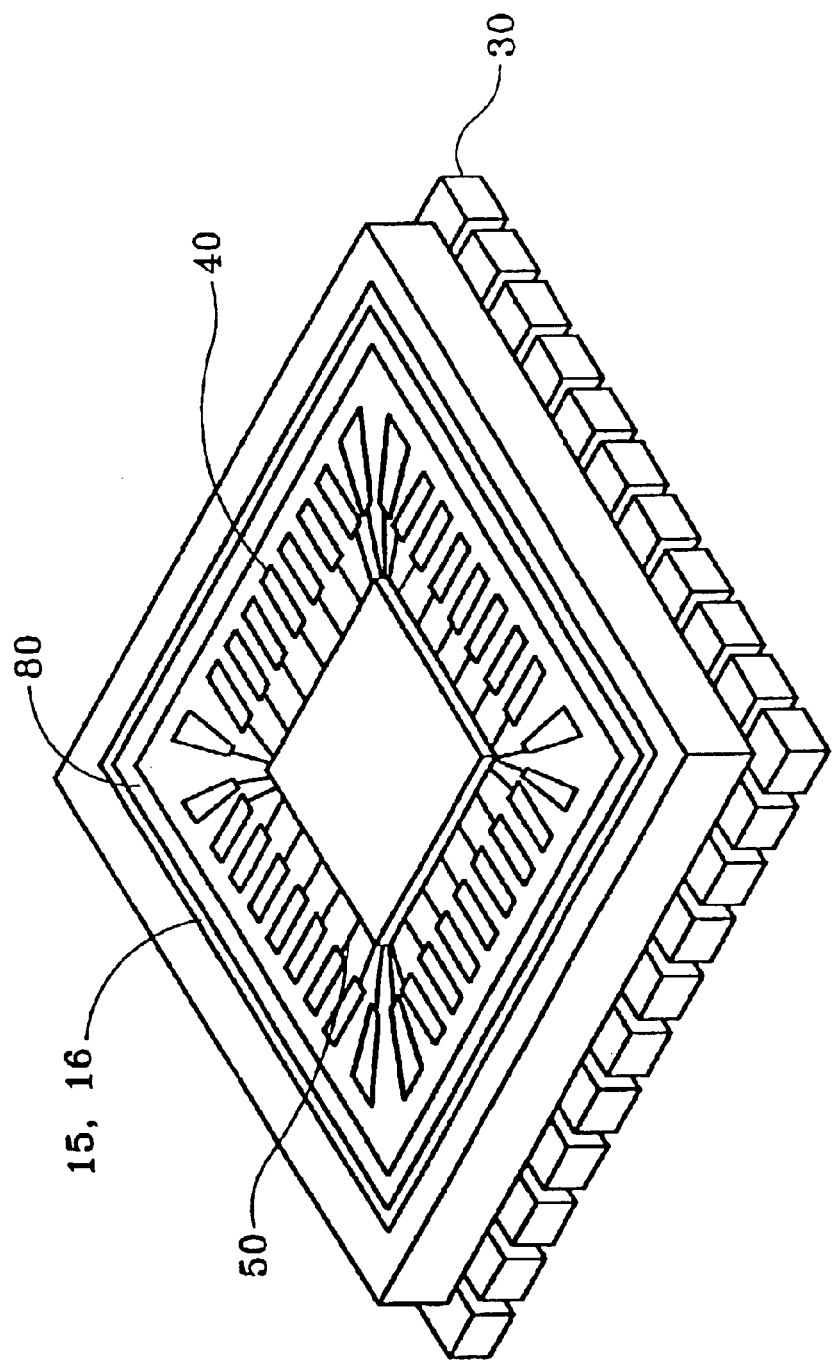
FIG. 3 is a perspective view of a windowed leadless semiconductor packaging apparatus having a stamped lead-frame having a plurality of leads sharing a common die by bonding a wire therebetween as viewed through a sight lid, in accordance with the present invention.

FIG. 3 illustrates, in perspective view, a windowed leadless semiconductor packaging apparatus 2000 having a stamped and/or bent lead-frame 30 formed by stamping and/or bending a conductive material such as copper, such unique stamping effecting removal of lead-frame material as indicated by void 35, sharing a common die 40 by bonding a wire 50 therebetween as viewed through the sight lid 80 sealed against a unique sealant seat 15, 16 having at least one channel formed in the cured polymeric body 13, the polymeric body 13 being formed by the foregoing unique compression-molding technique, in accordance with the present invention.

Figure 4:
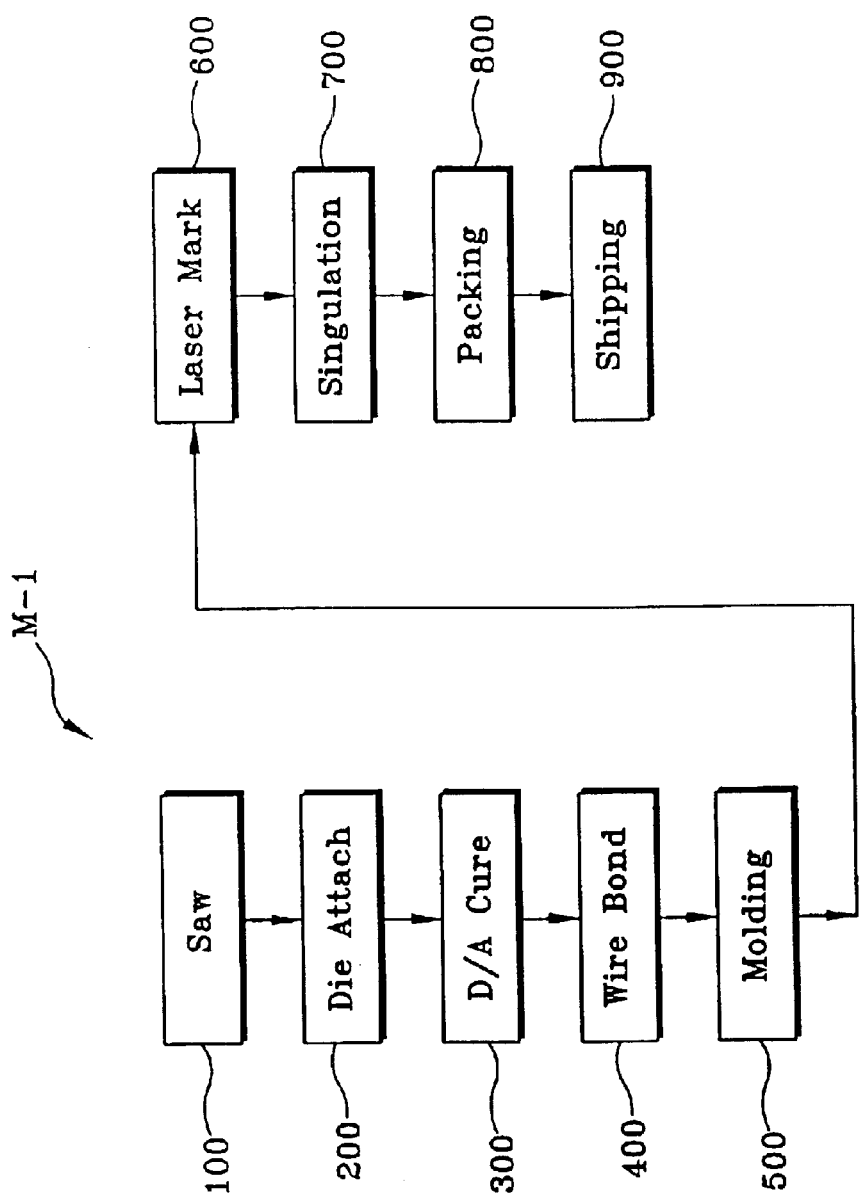
FIG. 4 is a flow-chart of a fabrication method for packaging a leadless semiconductor packaging apparatus, in accordance with the present invention.

FIG. 4 flow-charts the general fabrication method M-1 for packaging at least one leadless semiconductor packaging apparatus 1000, in accordance with the present invention. Method M-1 comprises the steps of: (a) providing at least one stamped lead-frame having at least one lead, by sawing or punch-cutting a lead-frame material as indicated by process block 100, (b) attaching a die to the at least one lead-frame by applying a non-electrically conductive adhesive material (die attach) as indicated by process block 200, (c) curing the non-electrically conductive adhesive material as indicated by process block 300, (d) bonding a wire from the die to each of the at least one lead as indicated by process block 400, (e) molding the semiconductor device components in another polymeric material, such as a polymeric molding compound, by a technique such as hot compression-molding using a hot-press having an upper platen and a lower platen, effecting a unique sealing orifice from which the external lead portion extends via a compressive force and a nominally localized deformation, thereby forming the at least one leadless semiconductor packaging apparatus 1000, as indicated by process block 500, (f) marking, by lasing, the at least one formed leadless semiconductor packaging apparatus 1000 as indicated by process block 600, (g) singulating, the at least one laser-marked leadless semiconductor packaging apparatus 1000, as indicated by process block 700, (h) packing the at least one singulated leadless semiconductor packaging apparatus 1000 as indicated by process block 800, and (1) shipping the at least one packed leadless semiconductor packaging apparatus 1000 as indicated by process block 900.

Figure 5:
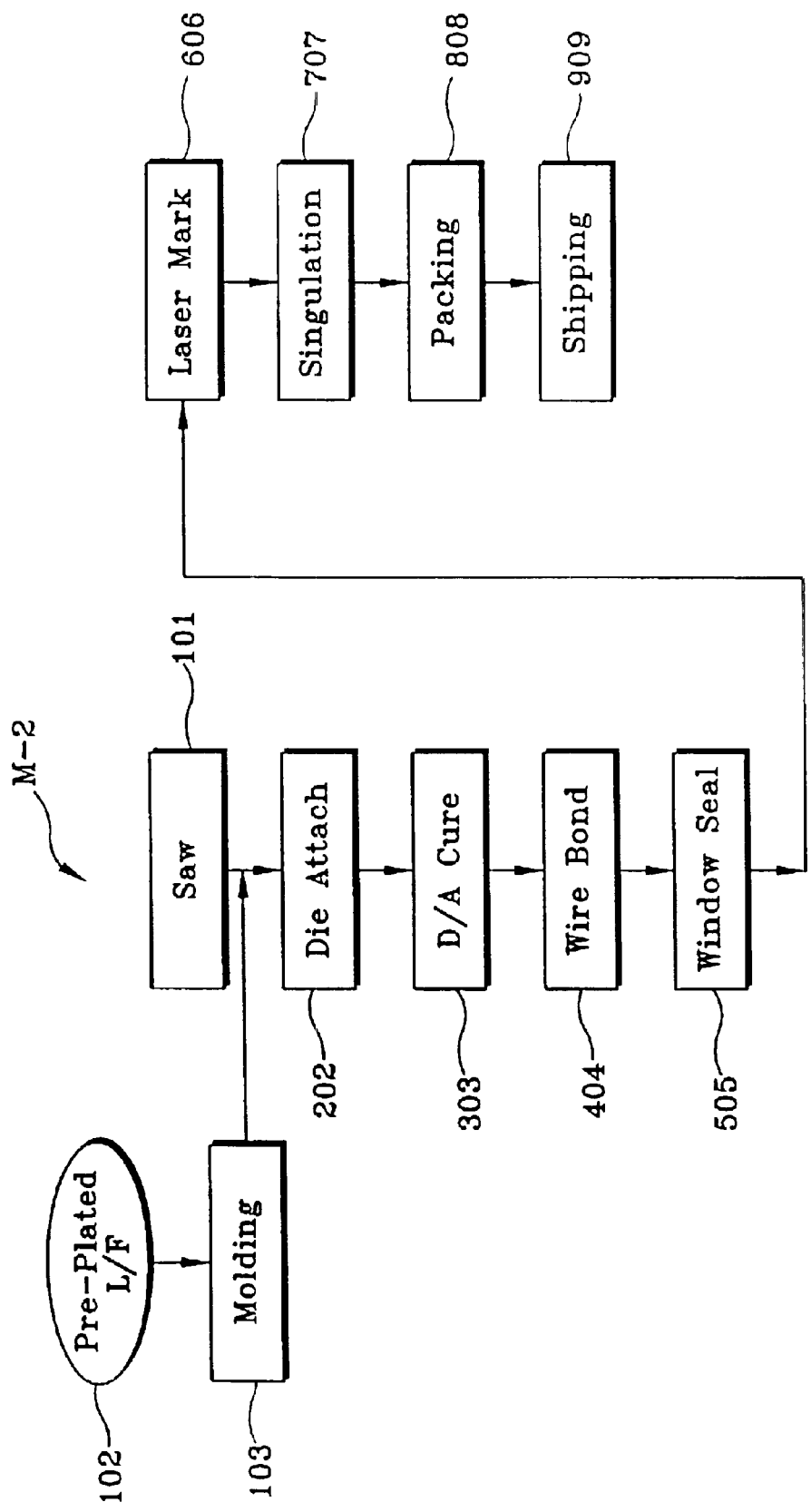
FIG. 5 is a flow-chart of a fabrication method for packaging a windowed leadless semiconductor packaging apparatus, in accordance with the present invention.

FIG. 5 flow-charts the general fabrication method M-2 for packaging at least one windowed leadless semiconductor packaging apparatus 2000, in accordance with the present invention. Method M-2 comprises the steps of: (a) providing at least one stamped lead-frame having at least one lead, by pre-plating a lead-frame material as indicated by process block 102, (b) molding the at least one stamped pre-plated lead-frame in a polymeric material, such as a polymeric molding compound, by a technique such as hot compression-molding usingahot-press having an upper platen and a lower platen, effecting a unique sealing orifice from which the external lead portion extends via a compressive force and a nominally localized deformation, as indicated by process block 103, (c) sawing or punch-cutting the lead-frame material as indicated by process block 101, (d) attaching a die to the at least one lead-frame (die attach) as indicated by process block 202, (e) curing the non-electrically conductive adhesive material as indicated by process block 303, (f) bonding a wire from the die to the at least one lead as indicated by process block 404, (g) installing a window onto the molded lead-frame by applying a sealant such as a UV-curable epoxy as indicated by process block 505, thereby forming the at least one leadless semiconductor packaging apparatus 2000, (h) marking, by laser techniques, the at least one formed windowed leadless semiconductor packaging apparatus 2000 as indicated by process block 606, (I) singulating the at least one laser-marked windowed leadless semiconductor packaging apparatus 2000, as indicated by process block 707, (j) packing the at least one singulated windowed leadless semiconductor packaging apparatus 2000 as indicated by process block 808, and (k) shipping the at least one packed windowed leadless semiconductor packaging apparatus 2000 as indicated by process block 909.

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims. Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, it should be readily apparent to those of ordinary skill in the art that various changes and modifications in form, semiconductor material, and fabrication material detail may be made without departing from the spirit and scope of the inventions as set forth in the appended claims. No claim herein is to be construed under the provisions of 35 U.S.C. §112, sixth paragraph, unless the element is expressly recited using the phrase "means for."

What is claimed:

1. A method of fabricating a leadless semiconductor product packaging apparatus for packaging a semiconductor circuit, comprising:

(a) stamping and downwardly bending a lead-frame, thereby forming a stamped downwardly bent lead-frame,
said step (a) comprising forming said stamped downwardly bent lead-frame to have an internal lead portion and an external lead portion, and
said step (a) comprising forming said stamped downwardly bent lead-frame to be in electrical contact with said semiconductor circuit;

(b) forming a housing member,
said step (b) comprising forming said housing member to comprise a housing material, and
said step (b) comprising forming said housing material to encapsulate said stamped downwardly bent lead-frame and to expose at least one solderable region of said external lead portions;

(c) forming a window lid member,
said step (c) comprising forming a portion of said housing member to comprise said window lid member, and
said step (c) comprising forming said window lid member to comprise at least one visually transparent material selected from a group consisting essentially of a polymer and a glass;

(d) forming a sealant seat, said step (d) comprising forming said sealant seat to comprise at least one channel disposed on an upper surface of said housing member for providing a larger sealing surface area; and (e) providing a sealant material, said step (e) comprising providing said sealant material to be disposed between said housing member and said window lid member over said at least one channel for preventing contaminant entry.

2. A method, as recited in claim 1,
wherein said semiconductor circuit comprises:
at least one die attach pad, wherein said semiconductor circuit is mounted on said die attach pad; and
at least one bonded wire,
wherein said at least one bonded wire effects an electrical connection between said circuit and said internal lead portion,
wherein said at least one bonded wire comprises at least one electrically conducting material selected from a group consisting essentially of copper, aluminum, and gold,
wherein said step (b) comprises providing said housing material to comprise a compression-molded housing material disposed around said die attach pad, said at least one bonded wire, and said internal lead portion,
wherein said step (b) comprises providing said housing material to not be disposed around said lead external portion, and
wherein said step (a) comprises forming said stamped downwardly bent lead-frame to comprise a thin lead frame material having a desired configuration for facilitating fit of said leadless semiconductor product packaging apparatus to a size in a range of chip-size to near chip-size.

3. A method, as recited in claim 2, wherein said step (a) comprises providing said thin lead frame material having a thickness in a range of 6 mils or less for facilitating said stamping and downwardly bending of said lead frame.

4. A method, as recited in claim 2, wherein a die is attachable, by a non-electrically conductive polymer, to each said internal portion of said stamped downwardly bent lead-frame.

5. A method, as recited in claim 1,
wherein said step (b) comprising forming said housing member to comprise a compression-molded housing material,
wherein said step (b) comprising providing said compression-molded housing material to comprise a polymeric molding compound,
whereby said external lead portion is exposed, thereby preserving a solderable area on said external lead portion, and thereby avoiding de-flashing of said external lead portion.

6. A method, as recited in claim 1,
wherein said step (a) comprising forming said stamped downwardly bent lead-frame to comprise at least one electrically conducting material selected from a group consisting essentially of copper, aluminum, and gold,
wherein said step (b) comprising providing said housing material to comprise at least one housing material selected from a group consisting essentially of a polymer and a ceramic, and
wherein said step (b) comprising providing said polymer to comprise at least one polymeric material selected from a group consisting essentially of an epoxy, a polyimide, and a bismaleimide.

* * * * *

UNITED STATES PATENT AND TRADEMARK OFFICE
CERTIFICATE OF CORRECTION

PATENT NO. : 6,797,541 B2
DATED : September 28, 2004
INVENTOR(S) : DoSung Chun and Sung Chul Chang It is certified that error appears in the above-identified patent and that said Letters Patent is hereby corrected as shown below:

Column 1,
Lines 19 and 20, please delete "This application claims priority from Korean Application Ser. No. 2002-42431, filed Jul. 19, 2002"

Signed and Sealed this

Fifth Day of April 2005

JON W. DUDAS
*Director of the United States Patent and Trademark Office*